(12) United States Patent
Nielsen et al.

(10) Patent No.: US 8,283,924 B2
(45) Date of Patent: Oct. 9, 2012

(54) EDDY-CURRENT ARTIFACT REDUCTION IN BALANCED STEADY-STATE FREE PRECESSION MAGNETIC RESONANCE IMAGING

(75) Inventors: Jon-Fredrik Nielsen, West Bloomfield, MI (US); Krishna S. Nayak, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 536 days.

(21) Appl. No.: 12/582,409

(22) Filed: Oct. 20, 2009

(65) Prior Publication Data

US 2010/0102816 A1 Apr. 29, 2010

Related U.S. Application Data

(60) Provisional application No. 61/106,782, filed on Oct. 20, 2008.

(51) Int. Cl.
*G01V 3/00* (2006.01)
(52) U.S. Cl. ........................................ 324/309; 324/311
(58) Field of Classification Search .................. 324/309, 324/311, 314, 300
See application file for complete search history.

(56) References Cited

U.S. PATENT DOCUMENTS

| | | | | |
|---|---|---|---|---|
| 5,560,361 A | * | 10/1996 | Glusick | 600/410 |
| 6,806,709 B2 | * | 10/2004 | Markl et al. | 324/309 |
| 7,046,004 B2 | | 5/2006 | Bieri et al. | |
| 7,372,266 B2 | | 5/2008 | Markl et al. | |
| 7,567,081 B2 | * | 7/2009 | Bieri et al. | 324/309 |

OTHER PUBLICATIONS

Nielsen, J.F. et al. Interleaved Balanced SSFP Imaging: Artifact Reduction Using Gradient Waveform Grouping. Journal of Magnetic Resonance Imaging 29: 745-750 (2009).
Bieri, O. et al. Analysis and Compensation of Eddy Currents in Balanced SSFP. Magnetic Resonance in Medicine 2005;54:129-137.
Jaynes, E.T. Matrix Treatment of Nuclear Induction. Physical Review, vol. 98, No. 4, May 15, 1955; pp. 1099-1105.
Markl, M. et al. Double Average Parallel Steady-State Free Precession Imaging: Optimized Eddy Current and Transient Oscillation Compensation. Magnetic Resonance in Medicine 2005, 54:965-974.
Nielsen, J-F. et al. Pulse Sequences for Phase-Contrast SSFP Imaging from a Single Steady-State. Proc. Intl. Mag. Reson. Med. 14, 2006, p. 879.
Scheffler, K. et al. Oscillating Steady States. Magnetic Resonance in Medicine 55: 598-603 (2006).

* cited by examiner

*Primary Examiner* — Louis Arana
(74) *Attorney, Agent, or Firm* — McDermott Will & Emery LLP

(57) ABSTRACT

Magnetic resonance imaging techniques are described that utilize bSSFP sequences in which two or more gradient waveforms are interleaved in a "groupwise" fashion, i.e., each waveform is executed consecutively two or more times before switching to the other waveform, where "N" counts the number of times each waveform is executed consecutively. As a result, embodiments of the present disclosure can mitigate steady-state signal distortions or artifacts in interleaved balanced steady-state free precession (bSSFP) caused by slightly unbalanced eddy-current fields. Related MRI systems are also described.

17 Claims, 6 Drawing Sheets

EDDY-CURRENT ARTIFACT REDUCTION IN BALANCED STEADY-STATE FREE PRECESSION MAGNETIC RESONANCE IMAGING

CROSS-REFERENCE TO RELATED APPLICATION

This application is based upon and claims priority to U.S. Provisional Patent Application No. 61/106,782, entitled "Method for Eddy-Current Artifact Reduction in Balanced Steady-State Free Precession Magnetic Resonance Imaging (MRI)," filed 20 Oct. 2008, client reference 09-079, the entire contents of which are incorporated herein by reference.

STATEMENT REGARDING FEDERALLY SPONSORED RESEARCH

This invention was made with Government support under contract grant numbers R01-HL074332 and R21-HL079987 awarded by the National Institutes of Health. The Government has certain rights in the invention.

BACKGROUND

Certain magnetic resonance balanced steady-state free precession (bSSFP) imaging applications require large and frequent changes in the gradient waveforms from one TR to the next. One such application of particular interest in our research group is bSSFP phase-contrast (PC) magnetic resonance imaging (MRI), which utilizes two or more images acquired with different gradient first moments at the echo time (TE). This can be achieved by switching between a positive and negative bipolar gradient pulse played before or after the data acquisition window, or by inverting the sign of the imaging gradients themselves. Unfortunately, different gradient wave-forms will in general produce slightly different residual eddy-current fields, which in turn give rise to small differences in the precession angle. As a result, switching between two waveforms on a TR-by-TR basis can produce an "oscillating" steady state for spins near on-resonance, resulting in severe image artifacts. For this reason, bSSFP PC-MRI has been limited to noninterleaved imaging, which limits the application of this technique to non real-time acquisitions, and makes the measurements more susceptible to patient motion.

It has been shown that eddy-current-induced bSSFP signal distortions for on-resonance spins can be mitigated by pairing the waveforms. See Bieri O., et al., "Analysis and compensation of eddy currents in balanced SSFP," Magn. Reson. Med. 2005;54:129-137; and U.S. Pat. No. 7,046,004; the entire contents of both of which are incorporated herein by reference. Waveform pairing can ensure that any eddy-current-induced change in precession angle in one TR is simply reproduced in the following TR. This tends to bring spins that are near on-resonance back to the same starting point, regardless of the precise value of the small and unknown eddy-current-induced change in precession angle.

Waveform pairing has been applied to several bSSFP imaging applications including phase-contrast imaging, however, paired interleaved bSSFP introduces signal distortions approximately halfway between the center of the bSSFP passband and the signal nulls. In order to suppress within-band signal distortions in paired bSSFP, Markl et al. proposed a "double average" (dAVE) acquisition scheme in which every phase-encode is acquired twice and the complex signals are averaged. See Markl M., et al., "Double average parallel steady-state free precession imaging: optimized eddy current and transient oscillation compensation," Magn. Reson. Med., 2005;54:965-974. Such dAVE imaging has the advantage that it simultaneously suppresses signal distortions due to both unbalanced eddy-currents and off-resonance-induced signal oscillations during the transient toward steady state, at the cost of doubling the acquisition time (for a given phase-encode acquisition scheme), however, twice the number of acquisitions and thus double the time is required.

SUMMARY

Embodiments of the present disclosure address shortcomings described previously by providing bSSFP sequences in which two gradient waveforms are interleaved in a "group-wise" fashion, i.e., each waveform is executed consecutively two or more times before switching to the other waveform. Such gradient waveform grouping provided by embodiments of the present disclosure can be utilized to mitigate steady-state eddy-current distortions in bSSFP sequences for various types of imaging applications, including both steady-state and transient imaging.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1:
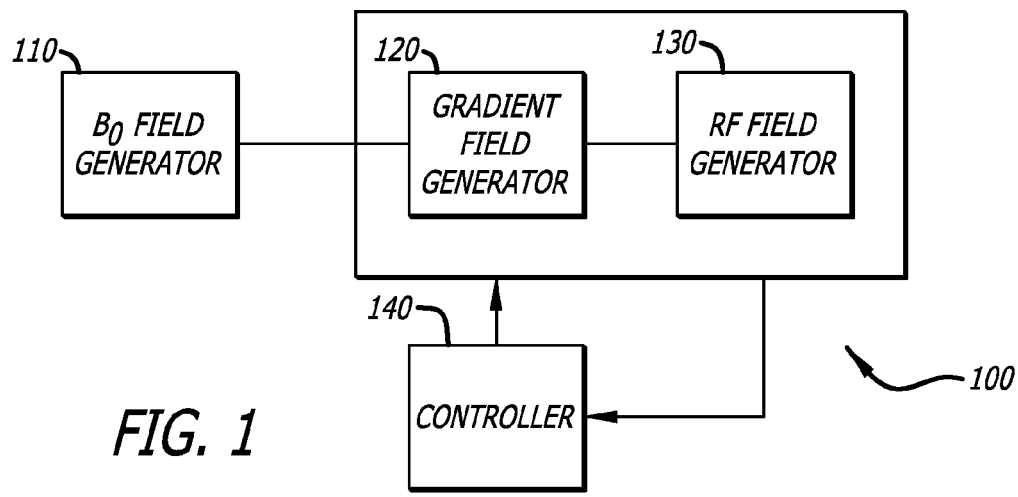
FIG. 1 depicts a schematic box diagram of a MRI system, in accordance with an exemplary embodiment of the present disclosure.

While certain embodiments are depicted in the drawings, one skilled in the art will appreciate that the embodiments depicted are illustrative and that variations of, those shown, as well as other embodiments described herein, may be envisioned and practiced within the scope of the present disclosure.

DETAILED DESCRIPTION OF ILLUSTRATIVE EMBODIMENTS

Illustrative embodiments are now discussed. Other embodiments may be used in addition or instead. Details that may be apparent or unnecessary may be omitted to save space or for a more effective presentation. Conversely, some embodiments may be practiced without all of the details that are disclosed.

Embodiments of the present disclosure provide for magnetic resonance imaging utilizing bSSFP sequences in which two or more gradient waveforms are interleaved in a "groupwise" fashion, i.e., each waveform is executed consecutively two or more times before switching to the other waveform (where "N" counts the number of times each waveform is executed consecutively). As a result, embodiments of the present disclosure can mitigate steady-state signal distortions/artifacts in interleaved balanced steady-state free precession (bSSFP) caused by slightly unbalanced eddy-current fields.

Embodiments of the present disclosure were tested to analyze the effects of unbalanced precession on the steady-state bSSFP magnetization, with particular attention to bSSFP PC-MRI sequences that rely on accurate blood signal phase measurements. Using numerical Bloch simulations and phantom experiments, it was shown for exemplary embodiments that steady-state signal distortions in interleaved bSSFP can be quantitatively accounted for by means of a simple model that associates an effective resonance offset with each gradient waveform. Extending the idea of pairing by executing the waveforms in groups of two or more is seen as offering a systematic and general strategy for reducing steady-state distortions within the bSSFP pass-band. Each phase-encode can be acquired only once for each sign of the bipolar velocity-encoding gradient, and consequently the overall acquisition time is not increased.

FIG. 1 illustrates a functional block diagram that provides a schematic overview of an MRI apparatus 100 in accordance with one embodiment of the methods and systems described in the present disclosure. Briefly, the apparatus 100 includes a static field generator 110, a gradient field generator 120, an RF excitation field generator 130, and a controller 140 that controls the operation of the gradient field generator 120 and the RF excitation field generator 130. The controller also analyzes or processes the FID (free induction decay) signals received by a receiver (not shown).

The static field generator 110 generates a strong static magnetic field $B_0$, which is used to line up nuclear spins in a target object (whose MRI image is being generated by the apparatus 100) along $B_0$. The gradient field generator 120 generates a gradient field $G(r)$, which is superimposed on the static field $B_0$, so that nuclei in a selected plane can be excited by a proper choice of the frequency spectrum of the transverse RF excitation field. The RF excitation field generator 130 generates an RF excitation field $B1$. When $B1$ is applied to the object, typically as an RF excitation pulse transverse to $B_0$, the nuclei become excited (due to the RF energy imparted by the RF excitation pulse), so that the nuclear spins rotate by a flip angle. Subsequently, the excited nuclei gradually return to alignment with the static field $B_0$, giving up the excitation energy in the form of weak but detectable FID signals, which are processed by the controller 140 to produce images of the target object.

The controller 140 controls the operation of the MRI apparatus 100, including but not limited to the generation of the fields $G(r)$, and $B1$, as well as the processing of the FID signals resulting from the de-excitation (precession and relaxation) of the nuclei in the object.

Numerical simulations were performed to investigate the effect of gradient waveform grouping on the steady-state magnetization profile over the full 1/TR SSFP band spacing. Simulations were performed in MatLab (MathWorks, Natick, Mass.) and assumed that SSFP imaging was performed using two different waveforms "A" and "B" that are switched every N TRs. For example, N=1 corresponds to directly interleaving the waveforms every TR ("ABABABAB . . . " ordering), and N=2 corresponds to waveform pairing ("AABBAABB . . . "). To simulate the effect of waveform-dependent changes in precession angle, the two waveforms were associated with two slightly different resonance offset frequencies $f_A$ and $f_B = \Delta f_{AB}$. Simulations were performed using relaxation parameters corresponding to five different tissue types at 3T (12,13): gray matter (T1/T2 =1820/99 msec), fat (T1/T2=383/68 msec), muscle (T1/T2=1412/50 msec), liver (T1/T2=812/42 msec), and blood (T1/T2=1932/275 msec).

The steady-state magnetization $m_{ss}$ for given values of $f_A$ and $\Delta f_{AB}$ was obtained by letting the magnetization evolve over time according to the Bloch equations and requiring the magnetization to return to the same value every 2N TRs. To facilitate these calculations, spin evolution was expressed as a matrix multiplication, which allows the steady-state signal to be obtained by solving the linear system:

$$m_{ss} = Am_{ss} + b \tag{EQ. 1}$$

where A (a 3×3 matrix) and b (a 3×1 column vector) express the accumulated influence of the RF excitations, T1 relaxation, T2 decay, and free precession that occur during the course of 2N TRs.

For exemplary embodiments, phantom imaging experiments were conducted. All experiments were performed on a GE Signa 3T Excite HD system (General Electric Medical Systems, Milwaukee, Wis.) using a "zoom" whole body gradient coil (peak gradient amplitude 40 mT/m, maximum slew rate 150 T/m/s). A spherical phantom (measured T1/T2=200/30 msec) was placed at the scanner isocenter and imaged with a bSSFP pulse sequence that interleaved the two different readout waveforms illustrated schematically in FIG. 2.

Figure 2:
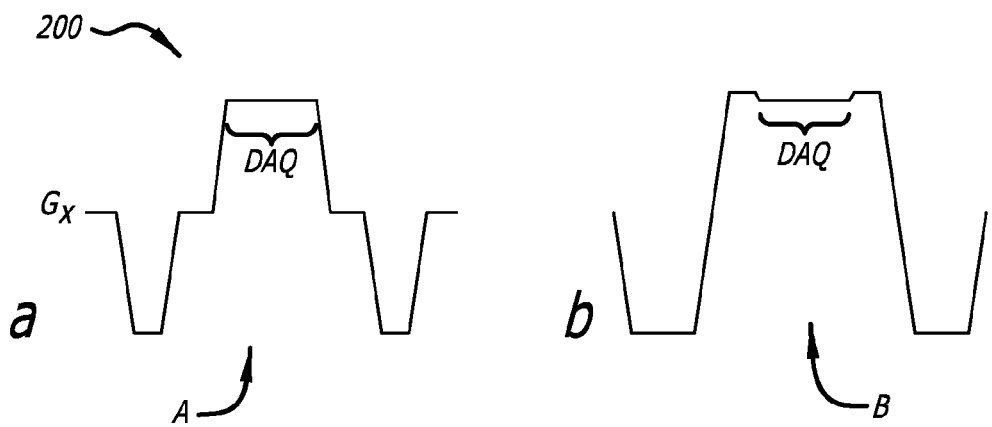
FIG. 2 shows two different readout waveforms (a)-(b) used in interleaved phantom and in vivo bSSFP experiments, in accordance with an exemplary embodiment of the present disclosure.

FIG. 2 shows a set 200 of two views (a)-(b) with different readout waveforms used in the interleaved phantom and in vivo bSSFP experiments, in accordance with an exemplary embodiment of the present disclosure. The data acquisition (DAQ) window is indicated by the shaded region. Both waveforms "A" and "B" produce the same FOV and matrix size, but have different gradient first moment at the echo (the center of the DAQ window). These waveforms can be used, e.g., to measure in-plane blood flow velocity.

The waveforms were switched every N TRs, with N=1 (direct interleaving), 2 (pairing), or 4 (an instance of grouping). In addition, a conventional noninterleaved reference image was acquired using waveform "A" only. Imaging parameters were: 1×1×3 mm voxel size; TR=8.0 msec; flip angle 40°; 180° RF phase cycling every TR; field-of-view (FOV)=16×20 cm (for noninterleaved bSSFP, and for N=1), 16×40 cm (for N=2), and 16×80 cm (for N=4). Gradient shims were manually adjusted such that the resonance offset varied linearly across the object along the phase-encode direction.

Signal profiles were measured along the phase-encode direction. To increase measurement signal-to-noise ratio (SNR), each point in the magnetization pro-file was obtained by averaging the signal from 40 adjacent pixels along the readout direction. It was empirically determined that reducing the number of averages did not affect the profile shape. Measured signal profiles were compared with simulation results by plotting the steady-state signal amplitude (i.e., the magnitude of the transverse magnetization) and phase-difference (between echoes 1 and N+1) over the 1/TR band spacing. The signal amplitude profiles were normalized by setting the peak signal in the noninterleaved case to 1 for both simulated and measured profiles. For the calculations pertaining to the embodiment, $\Delta f_{AB}$ was not measured independently, but acted as a (constant) fitting parameter.

In Vivo Imaging

Exemplary embodiments of the present disclosure can be used for cardiac, e.g., CINE, imaging. For an in vivo imaging application, cardiac flow imaging was performed in a healthy volunteer using an interleaved bSSFP phase-contrast sequence with the following parameters: ECG-gated CINE; single-slice 2DFT; flip angle 50°; 180° RF phase cycling every TR; FOV 20×25 cm; voxel size 1.7×3.1×7 mm; TR=3.6 msec; six views per cardiac phase (temporal resolution 43.6 msec); linear phase-encode view ordering; flow-encoding along readout direction, with velocity-encoding value (VENC)=4.6 m/s. The data were acquired with an eight-channel cardiac receive-only coil array on the same scanner used for the phantom experiments. Two sequences were compared: paired interleaved bSSFP (N=2), and grouped interleaved bSSFP with N=6. It can be noted that in the grouped interleaved acquisition the value of N was dictated by the desired temporal resolution. In particular, the maximum achievable temporal resolution was seen as decreasing as N increases, since the acquisition window per cardiac phase is at least 2N TRs.

Figure 3:
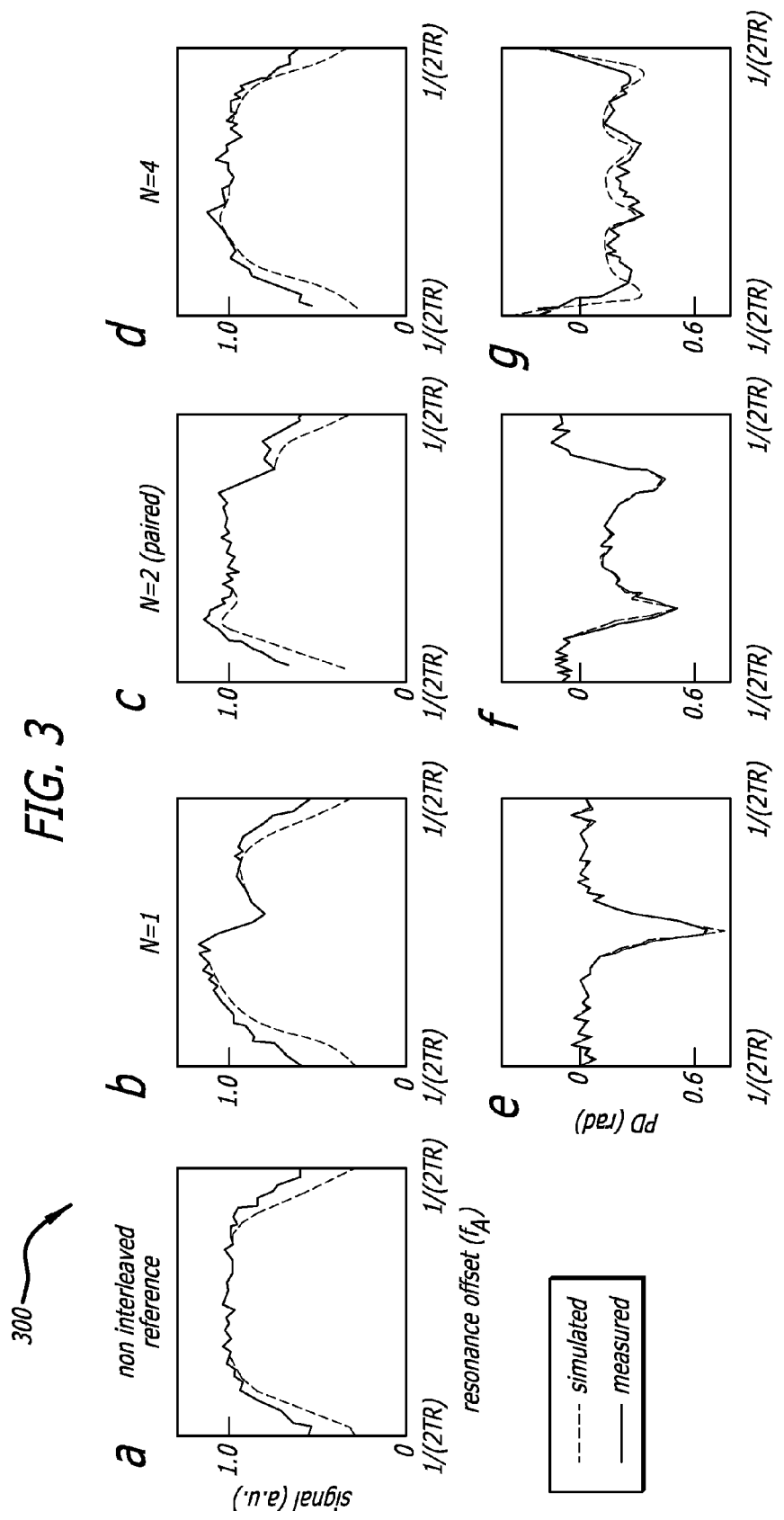
FIG. 3 depicts a set of plots (a)-(g) showing measured (solid) and calculated (dashed) magnetization profiles over the full 1/TR bSSFP band spacing, in accordance with an exemplary embodiment of the present disclosure.

FIG. 3 depicts a set 300 of plots (a)-(g) showing measured (solid) and calculated (dashed) magnetization profiles over the full 1/TR bSSFP band spacing, for an exemplary embodiment of the present disclosure. For the plots, 3(a) shows signal amplitude (magnitude of transverse magnetization) for noninterleaved bSSFP; 3(b)-3(d) show signal amplitude for the first of the 2N echoes, for 3(b) N=1, 3(c) N=2, and 3(d) N=4; 3(e)-3(g) show PD between echoes 1 and N+1, for 3(e) N=1, (f) N=2, and 3(g) N=4. Signal amplitude distortions 3(b)-3(d), and the size of the PD dips 3(e)-3(g), were observed as tending to decrease with increasing N. The simulated profiles were manually fitted to the measured data by adjusting $\Delta f_{AB}$.

Simulation results are shown for $\Delta f_{AB}$=4.0 Hz, which corresponds to a precession imbalance of 11.5°.

FIG. 3 shows measured (solid) magnetization profiles for resonance offset frequencies $f_A$ in the range (−1/(2TR), 1/(2TR)). Results are shown for both non-interleaved bSSFP and interleaved bSSFP with gradients switched every 1, 2, and 4 TRs. FIGS. 3(b)-3(d) show the signal amplitude for the first of the 2N echoes, whereas FIGS. 3(e)-3(g) show the phase-difference (PD) between echoes 1 and N+1. The PD between echoes, rather than the absolute phase of individual echoes, is plotted because it may be a particular quantity of interest in PC flow imaging. In FIGS. 3(e)-3(g), small DC offsets in the measured profiles were removed prior to plotting. For N=1, in FIGS. 3(b) and 3(e), the signal amplitude and PD near the center of the pass-band deviated strongly from the "ideal" non-interleaved signal. Pairing the waveforms, using N=2 in FIGS. 3(c) and 3(f), was shown to remove the artifact from the center of the passband, but introduced steady-state distortions near ±1/(4TR). Increasing N to 4, as shown in FIGS. 3(d) and 3(g), was shown to reduce the size of the signal amplitude and PD distortions.

With continued reference to FIG. 3, also shown are calculated (dashed) magnetization profiles for $\Delta f_{AB}$=4.0 Hz, which was the value determined (empirically) to produce the best fit with the measured signal profiles for the embodiment. This corresponds to a precession imbalance of 11.5°. In all plots the observed magnetization (both magnitude and PD) was seen as being in good agreement with theoretical predictions, except for a systematic difference near the band edges. Additional simulations for higher values of N (not shown) indicated that the number of PD dips is equal to N, and that the spacing between neighboring dips is 1/(N×TR).

Figure 4:
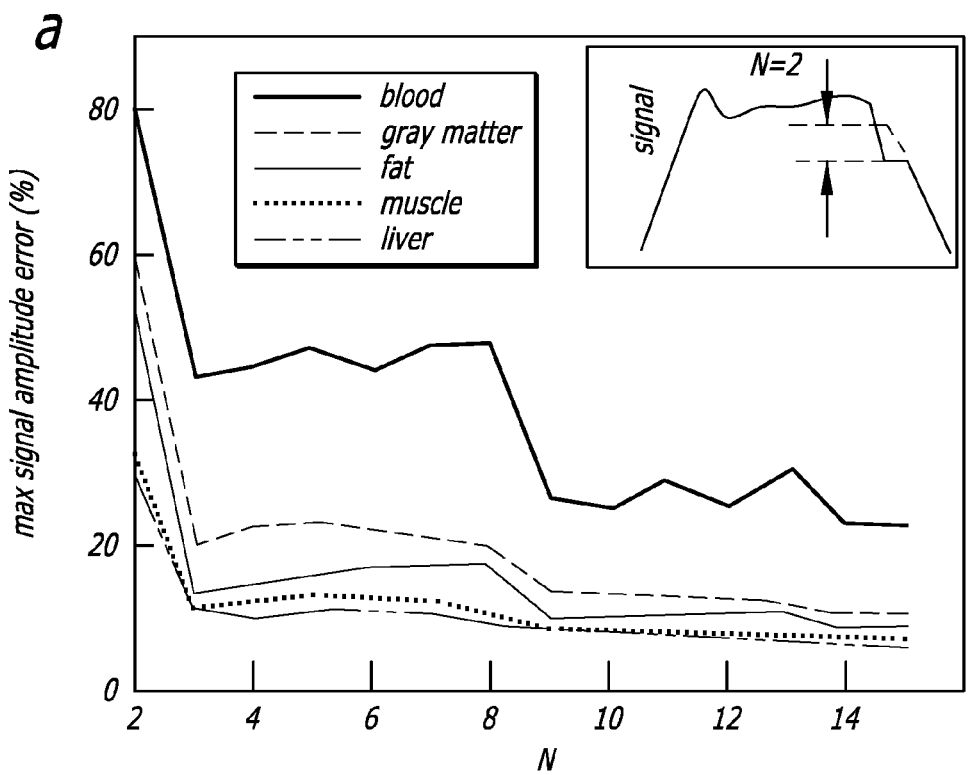
FIG. 4 depicts two views (a)-(b) of simulation results showing the impact of the choice of N (number of grouped waveforms) on steady-state signal distortions, in accordance with an exemplary embodiment of the present disclosure.
Figure 4:
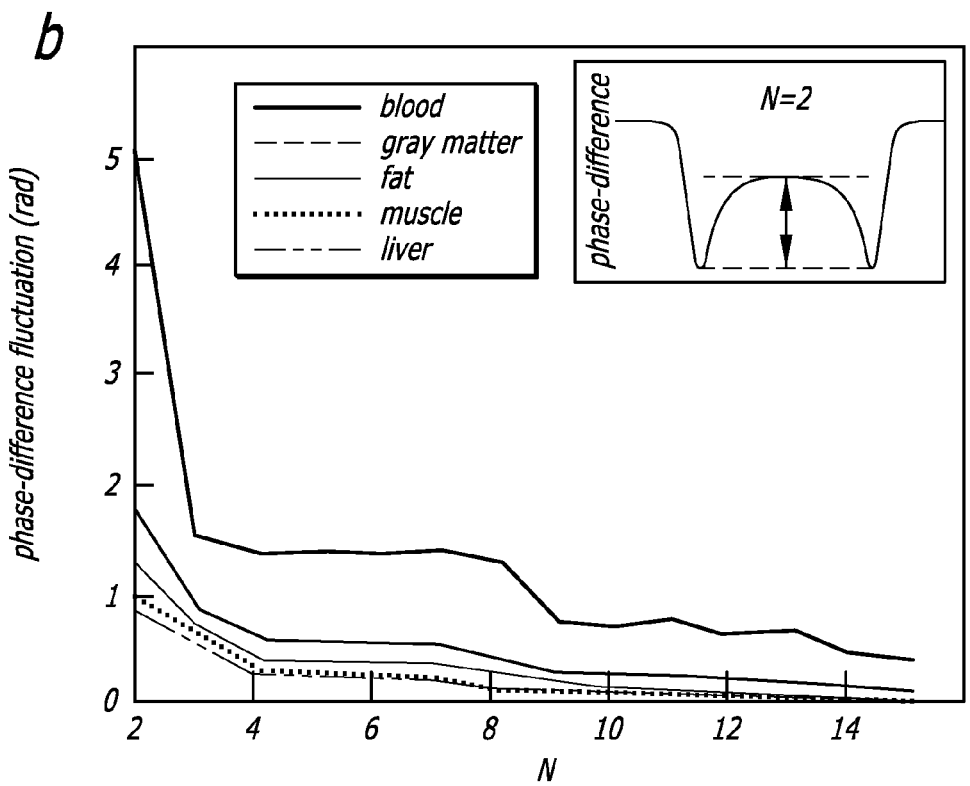

FIG. 4 depicts a set 400 of two views (a)-(b) of simulation results showing the impact of the choice of N (number of grouped waveforms) on steady-state signal distortions, in accordance with an embodiment of the present disclosure. Results are shown for N equal to every integer from 2 to 15, and for relaxation parameters corresponding to five different tissue types at 3T (12,13): gray matter (T1/T2=1820/99 msec), fat (T1/T2=383/68 msec), muscle (T1/T2=1412/50 msec), liver (T1/T2=812/42 msec), and blood (T1/T2=1932/275 msec).

FIG. 4(a) shows the maximum magnitude deviation over the passband of width 2/(3 TR), relative to the steady-state signal for a non-interleaved bSSFP sequence, as shown by the inset in FIG. 4(a). FIG. 4(b) shows the amplitude of the PD dip between echoes 1 and N+1, as shown by the inset in FIG. 4(b). FIG. 4 can be seen to predict that steady-state signal distortions are systematically reduced with increasing grouping number N, and are mitigated quite effectively as N increases beyond 4 for most tissues (e.g., liver, fat, gray matter, muscle). Blood, however, was seen as exhibiting relatively strong magnitude and phase distortions even for higher values of N.

FIG. 4 can be seen as suggesting that N should be chosen as large as possible to minimize steady-state distortions. However, the optimal choice of N will depend on the particular imaging application. In particular, in time-resolved (e.g., CINE) imaging the desired temporal resolution may place a practical limit on the maximum value of N.

FIG. 4 also indicates that while steady-state signal distortions are mitigated quite effectively for most tissues, PD distortions for blood remain relatively large even for N=10. This has implications for applications that rely on accurate blood phase estimation, such as phase-contrast velocity mapping. In such applications it may be necessary to consider not only large values of N, but also develop strategies for minimizing the difference in precession angle.

Figure 5:
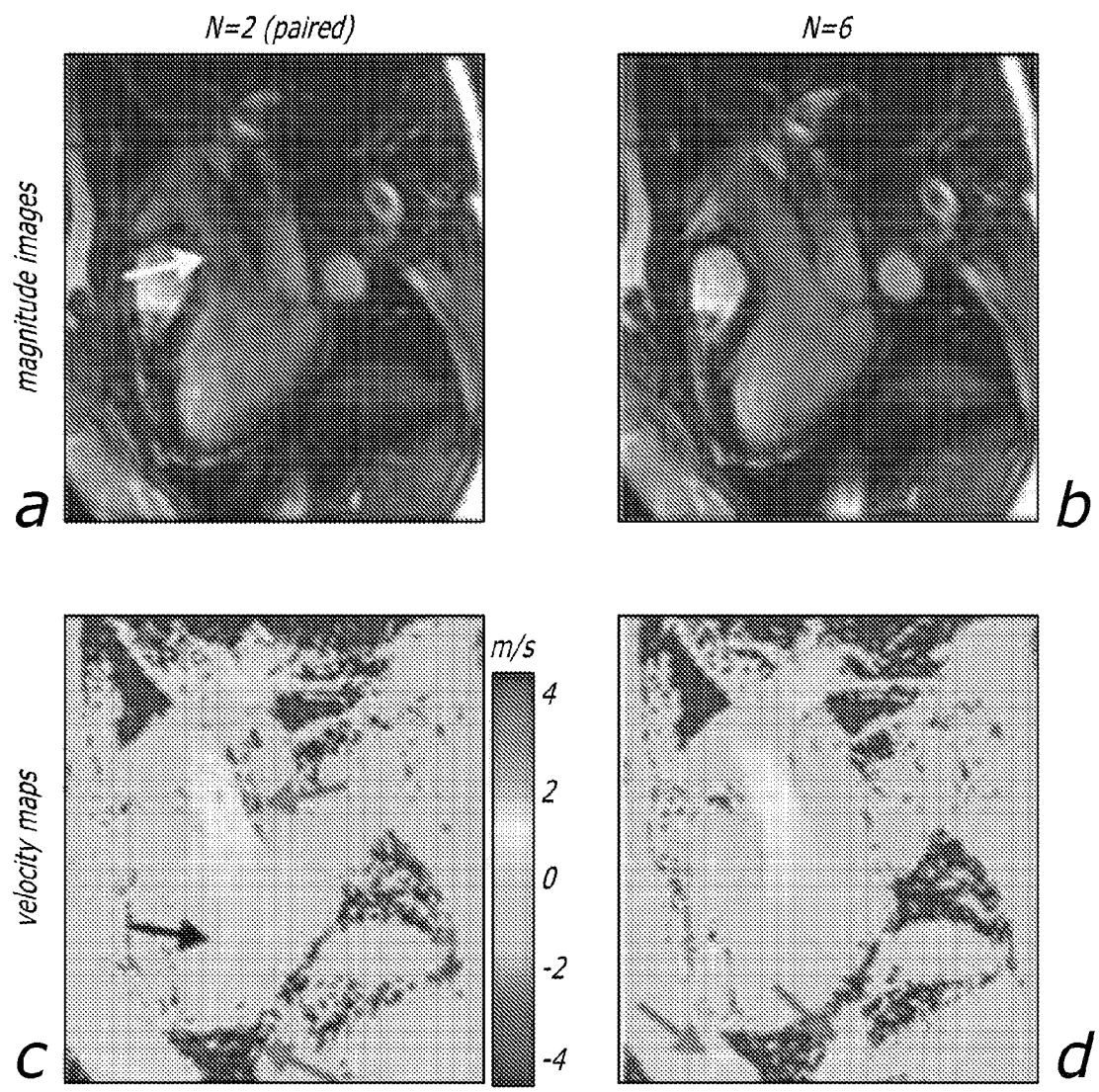
FIG. 5 depicts four views (a)-(d) showing interleaved bSSFP phase-contrast imaging in the heart (3-chamber view, mid-systole), in accordance with an exemplary embodiment of the present disclosure.

FIG. 5. depicts a set 500 of four views (a)-(d) showing of in vivo results for interleaved bSSFP phase-contrast imaging in the heart obtained with a VENC value of 4.6 m/s; FIGS. 5(a)-5(b) depict magnitude images while FIGS. 5(c)-5(d) depict velocity maps. Results are shown for both N=2, in FIGS. 5(a) and 5(c), and N=6, in FIGS. 5(b) and 5(d).

The images of FIG. 5 were obtained in a 3-chamber view, mid-systole. Rapid aortic blood flow is evident in both velocity images. Images obtained with N=2 exhibit signal loss, indicated by the arrow in FIG. 5(a), and velocity measurement errors, as indicated by the arrows in FIG. 5(c). The right two arrows in FIG. 5(c) identify velocity measurement distortions that appear to be related to FOV/2 ghosting from posterior subcutaneous fat. These artifacts are not present in the grouped interleaved bSSFP acquisition shown in FIGS. 5(b) and 5(d). Arrows in FIG. 5(d) indicate residual artifacts in the grouped acquisition. This is consistent with the expectation that images acquired with a given value of N can exhibit ghosts spaced FOV/N apart, e.g., due to a large PD (or misalignment) between echoes. These artifacts are not present in the grouped interleaved bSSFP acquisition, FIGS. 5(b) and (d). The artifacts identified by arrows in FIG. 5(d) indicate that artifacts have been suppressed but not completely removed. In can be noted that the artifacts in FIG. 5(a) are not due to off-resonance-induced transient oscillations, since such oscillations would occur independently of the waveform grouping number N, and thus would affect the two acquisitions equally. Similarly, the artifacts in FIG. 5(a) are not due to first-moment-uncompensated phase-encode gradients, since the PE gradients were identical for the two acquisitions.

Figure 6:
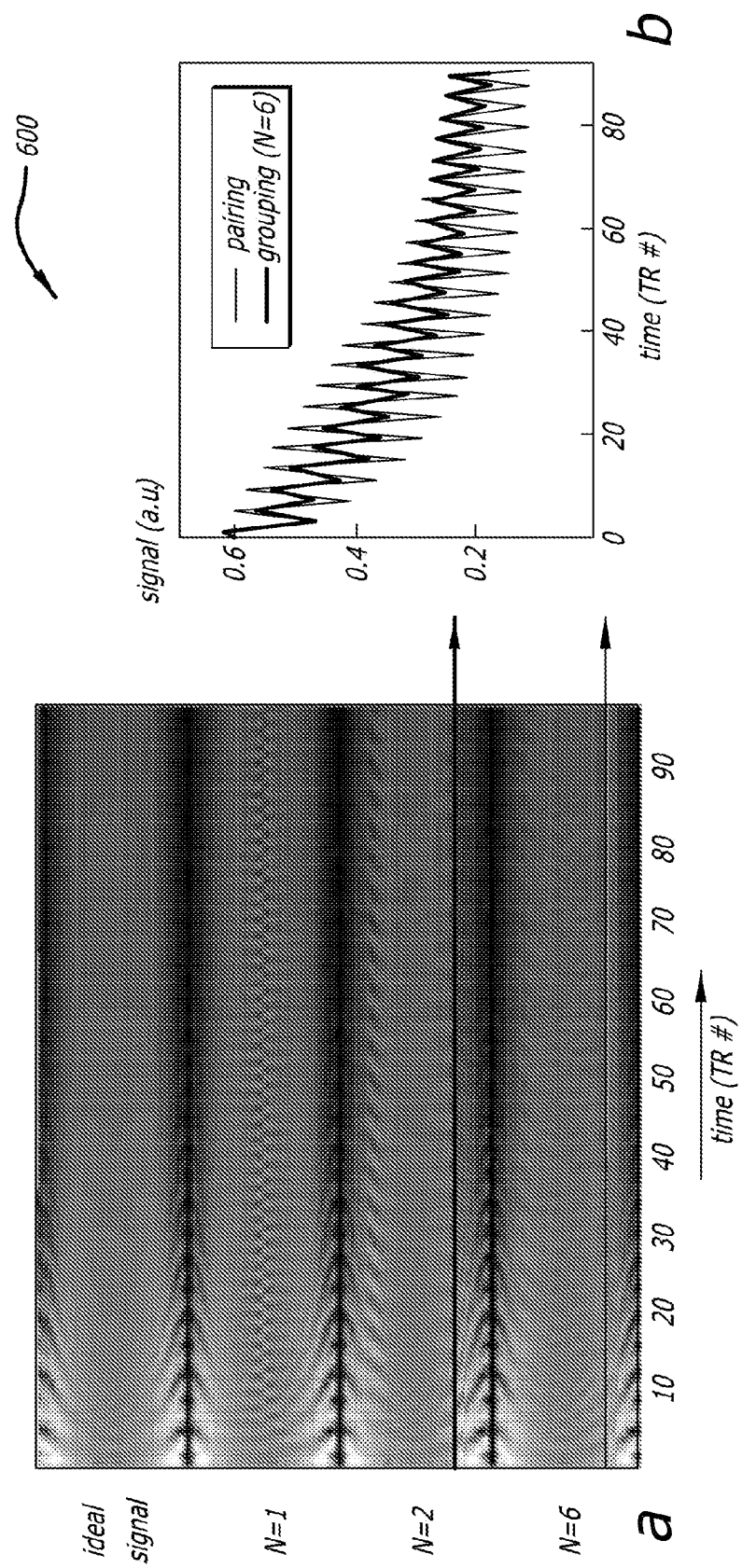
FIG. 6 depicts two views (a)-(b) showing the benefit of gradient waveform grouping during the transient toward steady state, in accordance with an exemplary embodiment of the present disclosure.

FIG. 6 depicts a composite 600 of two views 6(a)-6(b) showing the benefit of gradient waveform grouping during the transient toward steady state. FIG. 6(a) shows simulated transient steady-state signal profiles following an 8-TR Kaiser ramp preparation (not shown) for both noninterleaved bSSFP ("ideal signal") and interleaved bSSFP with N=1, 2, and 6. FIG. 6(b) shows signal measured along the solid thin (N=2) and thick (N=6) lines. The following simulation parameters were used: $\Delta f_{AB}$=4.0 Hz, T1/T2=383/68 msec; TR=4 msec; flip angle=50°. Signal oscillations due to unbalanced eddy-currents occurred both during the transient and steady state.

Although the analysis presented herein for some exemplary embodiments applies only to imaging in the steady state, additional simulation were performed that indicate that transient imaging can also benefit from gradient waveform grouping. Grouping the waveforms in groups of six resulted in reduced oscillations compared to N=2. FIG. 6 shows that signal oscillations due to imbalanced precession occur not just in the steady-state, but also in the transient phase. FIG. 6 also suggests that waveform grouping may be an effective strategy for mitigating eddy-current oscillations during both transient and steady-state imaging.

Embodiments of the present disclosure have employed a relatively simple model, namely, that the effect of different waveforms is to alter the precession angle by an amount $2\pi\Delta f_{AB}TR$. Strictly speaking, since residual eddy-current fields have in fact been shown to be time-varying, it could be more accurate to include a time-varying $\Delta f_{AB}(t)$ in a model. However, since eddy-fields have also been shown to be short-lived (<1 msec), the steady-state distortions may be expected to depend only on the net precession angle $$\int_0^{TR} 2\pi\Delta f_{AB}(t)\,dt$$

over the entire TR, and thus to be independent of the precise form of $\Delta f_{AB}(t)$. In other words, the "effect" of each waveform only lasts for at most one TR, and does not carry over into subsequent TRs. This further suggests that the analysis presented herein may apply to all bSSFP sequences that exhibit unbalanced precession, regardless of the physical cause of the imbalance.

In order to achieve reasonable image quality for embodiments including cardiac velocity-mapping experiments (even for N=6), it was necessary to choose a rather large VENC value (4.6 m/s). It was observed empirically that reducing the VENC, thereby making the two interleaved gradient waveforms increasingly dissimilar, leads to increased ghosting artifacts and signal loss. This is likely due to increased eddy-current-induced precession imbalance as the gradients become more dissimilar. A VENC value as high as 4-5 m/s may be suitable for imaging stenotic jets, but may be too high to allow meaningful myocardial tissue velocity mapping. In order to perform interleaved bSSFP velocity mapping with more typical VENC values of 1.5 m/s or less, it may be necessary to apply additional methods for eddy-current artifact suppression.

Figure 7:
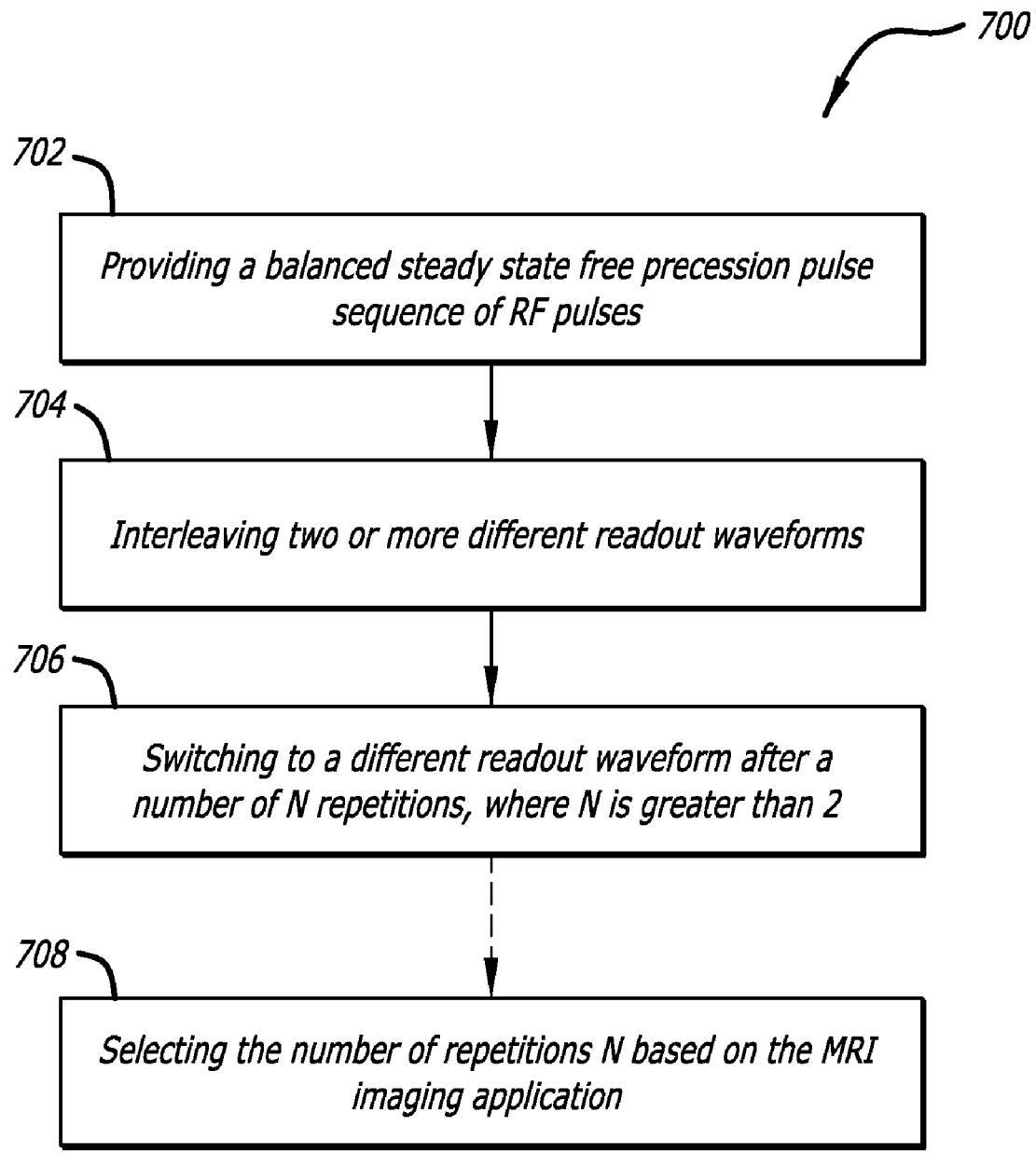
FIG. 7 depicts a diagrammatic outline of a method of artifact reduction using gradient waveform grouping for balanced SSFP imaging, in accordance with an exemplary embodiment of the present disclosure.

FIG. 7 depicts a diagrammatic outline of a method 700 of artifact reduction using gradient waveform grouping for balanced SSFP imaging, in accordance with an exemplary embodiment of the present disclosure. For the method 700, a balanced steady state free precession pulse sequence of RF pulses can be provided for imaging an object, as described at 702. For the bSSFP pulse sequence, two (or more) different readout waveforms can be interleaved, as described at 704. While exemplary embodiments described herein have included the repetition of identical waveforms (e.g., waveform "A" of FIG. 2) a number of N times (e.g., N=5), other embodiments of the present disclosure can include that repeated waveforms are similar but not necessarily identical.

With continued reference to FIG. 7, the waveforms can be switched every N TRs, as described at 706. The number of N TRs can optionally be selected as desired, e.g., based on a particular imaging application, as described at 708.

Accordingly, embodiments of the present disclosure can provide gradient waveform grouping as a simple and general approach to mitigating steady-state signal distortions in interleaved balanced SSFP. When waveforms are executed in groups of N, signal profile variations tend to improve as N increases. Embodiments of the present disclosure can provide grouping of waveforms which may also benefit applications that acquire images during the transient approach to steady state.

The components, steps, features, objects, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits and advantages. These also include embodiments in which the components and/or steps are arranged and/or ordered differently.

In reading the present disclosure, one skilled in the art will appreciate that embodiments of the present disclosure can be implemented in hardware, software, firmware, or any combinations of such, and over one or more networks. Moreover, embodiments of the present disclosure can be included in or carried by various signals, e.g., as transmitted over a wireless RF or IR communications link or downloaded from the Internet.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials that have been described and their equivalents. Similarly, the phrase "step for" when used in a claim embraces the corresponding acts that have been described and their equivalents. The absence of these phrases means that the claim is not intended to and should not be interpreted to be limited to any of the corresponding structures, materials, or acts or to their equivalents.

Nothing that has been stated or illustrated is intended or should be interpreted to cause a dedication of any component, step, feature, object, benefit, advantage, or equivalent to the public, regardless of whether it is recited in the claims.

The scope of protection is limited solely by the claims that now follow. That scope is intended and should be interpreted to be as broad as is consistent with the ordinary meaning of the language that is used in the claims when interpreted in light of this specification and the' prosecution history that follows and to encompass all structural and functional equivalents.

The invention claimed is:

1. A method of artifact reduction using gradient waveform grouping for balanced SSFP imaging, the method comprising:
   with a MRI system, providing a balanced steady state free precession (SSFP) pulse sequence of RF pulses and balanced gradient pulses to an object;
   interleaving two different gradient waveforms of the SSFP pulse sequence;
   switching between from a first of the two different gradient waveforms to the second gradient waveform after a number of N repetitions, where N>2; and
   imaging the object with the MRI system.

2. The method of claim 1, wherein the repetition time (TR) is 8.0 ms.

3. The method of claim 1, wherein providing a balanced steady state free precession pulse sequence comprises providing a plurality of phase encoding steps, wherein each phase encoding step comprises a slice selection gracient, a phase encoding gradient, and a readout gradient.

4. The method of claim 1, wherein a flip angle is 40°.

5. The method of claim 4, wherein 180° phase cycling occurs every TR.

6. The method of claim 1, wherein N=4.

7. The method of claim 1, wherein N=6.

8. The method of claim 1, wherein imaging an object comprises CINE imaging.

9. The method of claim 8, wherein the SSFP pulse sequence comprises a single-slice 2DFT pulse sequence.

10. The method of claim 8, wherein the flip angle is about 50°.

11. The method of claim 1, wherein a velocity-encoding value (VENC) is about 4.6 m/s.

12. The method of claim 1, wherein imaging the object comprises transient imaging.

13. A MRI system for generating MRI images of an object, the MRI system comprising:
   a static field generator configured to generate a static magnetic field $B_0$;
   a gradient field generator configured to generate a time-varying gradient field G(r), parallel to $B_0$; and
   an RF excitation pulse generator configured to generate an RF excitation field B1 and apply the field B1 to the object so that nuclear spins in the object flip at a flip angle; and
   a balanced SSFP pulse sequence of RF and gradient pulses, wherein the SSFP pulse sequence includes two interleaved different gradient waveforms that are alternated after a number of N repetitions, where N>2; and
   an image processing system configured and arranged to display images of the object.

14. The system of claim 13, wherein the SSFP pulse sequence comprises a single-slice 2DFT pulse sequence.

15. The system of claim 13, wherein the VENC is about 4.6 m/s.

16. The system of claim 13, wherein N=6.

17. An MRI controller system for a magnetic resonance imaging (MRI) system, the system comprising:
   a controller configured and arranged to (i) control an RF excitation pulse generator and gradient field generator to produce a balanced steady state free precession (SSFP) pulse sequence, (ii) interleave two different gradient waveforms of the SSFP pulse sequence, (iii) switch between a first of the two different gradient waveforms to the second gradient waveform after a number of N repetitions, where N >2, (iv) image an object with the MRI system.

* * * * *